(12) United States Patent
Sills et al.

(10) Patent No.: US 9,853,211 B2
(45) Date of Patent: Dec. 26, 2017

(54) ARRAY OF CROSS POINT MEMORY CELLS INDIVIDUALLY COMPRISING A SELECT DEVICE AND A PROGRAMMABLE DEVICE

(71) Applicant: Micron Technology, Inc., Boise, ID (US)

(72) Inventors: Scott E. Sills, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/808,976

(22) Filed: Jul. 24, 2015

(65) Prior Publication Data

US 2017/0025604 A1  Jan. 26, 2017

(51) Int. Cl.
*H01L 27/24* (2006.01)
*H01L 45/00* (2006.01)

(52) U.S. Cl.
CPC ........ *H01L 45/065* (2013.01); *H01L 27/2409* (2013.01); *H01L 27/2463* (2013.01);
(Continued)

(58) Field of Classification Search
CPC ... H01L 45/065; H01L 27/2409; H01L 45/16; H01L 27/2463; H01L 45/1233; H01L 45/1253
(Continued)

(56) References Cited

U.S. PATENT DOCUMENTS 6,236,076 B1   5/2001   Arita et al.
6,242,299 B1   6/2001   Hickert
(Continued)

FOREIGN PATENT DOCUMENTS

EP   14836755.0   2/2017
JP   H09-232447   9/1997
(Continued)

OTHER PUBLICATIONS

Kim et al.; A Functional Hybrid Memristor Crossbar Array/CMOS System for Data Storage and Neuromorphic Applications; Nano Letters; Dec. 5, 2011; pp. 389-395.
(Continued)

*Primary Examiner* — Allen Parker
*Assistant Examiner* — Didarul Mazumder
(74) *Attorney, Agent, or Firm* — Wells St. John P.S.

(57) ABSTRACT

A method of forming an array of cross point memory cells comprises forming spaced conductive lower electrode pillars for individual of the memory cells being formed along and elevationally over spaced lower first lines. Walls cross elevationally over the first lines and between the electrode pillars that are along the first lines. The electrode pillars and walls form spaced openings between the first lines. The openings are lined with programmable material of the memory cells being formed to less-than-fill the openings with the programmable material. Conductive upper electrode material is formed over the programmable material within remaining volume of the openings and spaced upper second lines are formed which cross the first lines elevationally over the conductive upper electrode material that is within the openings. A select device is between the lower electrode pillar and the underlying first line or is between the conductive upper electrode material and the overlying second line for the individual memory cells. Aspects of the invention include an array of cross point memory cells independent of method of manufacture.

16 Claims, 15 Drawing Sheets

(52) U.S. Cl.
CPC ...... *H01L 45/1233* (2013.01); *H01L 45/1253* (2013.01); *H01L 45/16* (2013.01)

(58) Field of Classification Search
USPC .............................................................. 257/4
See application file for complete search history.

(56) References Cited

U.S. PATENT DOCUMENTS

| | | |
|---|---|---|
| 6,256,220 B1 | 7/2001 | Kamp |
| 6,370,056 B1 | 4/2002 | Chen et al. |
| 6,674,109 B1 | 1/2004 | Fujimori et al. |
| 6,717,215 B2 | 4/2004 | Fricke et al. |
| 6,717,838 B2 | 4/2004 | Hosoi |
| 6,885,048 B2 | 4/2005 | Tarui et al. |
| 7,180,141 B2 | 2/2007 | Eliason et al. |
| 7,525,830 B2 | 4/2009 | Kang |
| 7,902,594 B2 | 3/2011 | Ono |
| 8,021,897 B2 | 9/2011 | Sills et al. |
| 8,304,823 B2 | 11/2012 | Boescke |
| 8,796,085 B2 | 8/2014 | Koldiaev |
| 9,276,092 B1 | 3/2016 | Karda |
| 2002/0125536 A1 | 9/2002 | Iwasa et al. |
| 2003/0001189 A1 | 1/2003 | Fujiwara et al. |
| 2003/0075753 A1 | 4/2003 | Chu et al. |
| 2003/0183936 A1 | 10/2003 | Ito et al. |
| 2004/0002176 A1 | 1/2004 | Xu |
| 2004/0004240 A1 | 1/2004 | Nishikawa |
| 2004/0036111 A1 | 2/2004 | Nishikawa et al. |
| 2004/0090815 A1 | 5/2004 | Tajiri |
| 2005/0282296 A1 | 12/2005 | Hsu et al. |
| 2006/0014307 A1 | 1/2006 | Kweon |
| 2007/0035984 A1 | 2/2007 | Arai |
| 2007/0108524 A1 | 5/2007 | Ito et al. |
| 2007/0272960 A1 | 11/2007 | Hsu et al. |
| 2007/0285970 A1 | 12/2007 | Toda et al. |
| 2008/0225569 A1 | 9/2008 | Nawano |
| 2009/0095950 A1 | 4/2009 | Lieber et al. |
| 2009/0250681 A1 | 10/2009 | Smythe et al. |
| 2010/0039850 A1 | 2/2010 | Kitazaki |
| 2010/0110753 A1 | 5/2010 | Slesazeck |
| 2010/0110758 A1 | 5/2010 | Li |
| 2010/0140589 A1 | 6/2010 | Ionescu |
| 2010/0207168 A1 | 8/2010 | Sills et al. |
| 2010/0321975 A1 | 12/2010 | Kimura |
| 2011/0033955 A1 | 2/2011 | Kang |
| 2011/0037046 A1 | 2/2011 | Sato et al. |
| 2011/0210326 A1 | 9/2011 | Suzawa et al. |
| 2011/0248324 A1 | 10/2011 | Kang |
| 2011/0292713 A1* | 12/2011 | Perner .................... G11C 5/063 365/148 |
| 2012/0001144 A1 | 1/2012 | Greeley et al. |
| 2012/0164798 A1 | 6/2012 | Sills et al. |
| 2012/0248398 A1 | 10/2012 | Liu |
| 2012/0280291 A1 | 11/2012 | Lee et al. |
| 2012/0292584 A1* | 11/2012 | Rocklein ................ H01L 45/08 257/2 |
| 2012/0319185 A1 | 12/2012 | Liang et al. |
| 2012/0327714 A1* | 12/2012 | Lue ......................... G11C 5/02 365/185.17 |
| 2013/0020575 A1 | 1/2013 | Ishizuka et al. |
| 2013/0043455 A1 | 2/2013 | Bateman |
| 2013/0056698 A1 | 3/2013 | Satoh et al. |
| 2013/0092894 A1 | 4/2013 | Sills et al. |
| 2013/0099303 A1 | 4/2013 | Huang et al. |
| 2013/0126816 A1* | 5/2013 | Tang ................... H01L 27/2463 257/3 |
| 2013/0193400 A1 | 8/2013 | Sandhu et al. |
| 2014/0034896 A1 | 2/2014 | Ramaswamy et al. |
| 2014/0077150 A1 | 3/2014 | Ho et al. |
| 2014/0097484 A1 | 4/2014 | Seol et al. |
| 2014/0153312 A1 | 6/2014 | Sandhu et al. |
| 2014/0269002 A1 | 9/2014 | Jo |
| 2014/0269046 A1 | 9/2014 | Laurin et al. |
| 2015/0097154 A1 | 4/2015 | Kim et al. |
| 2015/0129824 A1* | 5/2015 | Lee ........................ H01L 45/04 257/2 |

FOREIGN PATENT DOCUMENTS

| | | |
|---|---|---|
| JP | 2003-045174 | 2/2003 |
| JP | 2009-170511 | 7/2009 |
| KR | 10-2015-0041705 | 4/2015 |
| TW | 449924 | 8/2001 |
| TW | 483170 | 4/2002 |
| WO | WO 2008-073529 | 6/2008 |
| WO | PCT/US2014/047570 | 11/2014 |
| WO | PCT/US2015/025894 | 7/2015 |
| WO | PCT/US2015/032999 | 8/2015 |
| WO | PCT/US2014/047570 | 2/2016 |
| WO | PCT/US2016/013174 | 5/2016 |
| WO | PCT/US16/040131 | 10/2016 |
| WO | PCT/US2015/025894 | 10/2016 |
| WO | PCT/US2016/42719 | 10/2016 |
| WO | PCT/US2015/032999 | 12/2016 |

OTHER PUBLICATIONS

Lee et al.; Internal resistor of multi-functional tunnel barrier for selectivity and switching uniformity in resistive random access memory; Nanoscale Research Letters; 2014; 7 pp.
U.S. Appl. No. 13/964,309, filed Aug. 12, 2013, Karda et al.
U.S. Appl. No. 14/152,664, filed Jan. 10, 2014, Karda.
U.S. Appl. No. 14/260,977, filed Apr. 24, 2014, Ramaswamy.
U.S. Appl. No. 14/305,459, filed Jun. 16, 2014, Ramaswamy et al.
U.S. Appl. No. 14/508,912, filed Oct. 7, 2014, Ramaswamy.
Breakdown of High-Performance Monolayer MoS2 Transistors; Lembke et al.; www.acsnano.org; Oct. 2012; pp. A-F.
Current Status of Ferroelectric Random-Acess Memory; Arimoto et al.; MRS Bulletin; Nov. 2004; pp. 823-828.
Das et al.; High Performance Multliayer MoS2 Transistors with Scandium Contacts; NANO Letters; ACS Publications; Dec. 14, 2012; pp. 100-105.
Ferroelectric Nonvolatile Nanowire Memory Circuit Using a Single ZnO Nanowire and Copolymer Top Layer; Tack Lee et al.; Advanced Materials 2012, 24, pp. 3020-3025.
Ferroelectric RAM; http://en.wikipedia.org/wiki/Ferroelectric_RAM; Last Modified Feb. 25, 2013; 6 pp.
Large Area Vapor Phase Growth and Characterization of MoS2 Atomic Layers on SiO2 Substrate; Zhan et al.; Dept. of Mechanical Engineering & Materials Science; Rice University: Feb. 15, 2012; 24 pp.
Liu et al.; Growth of Large-Area and Highly Crystailine MoS2 Thin Layers on Insulating Substrates; NANO Letters; ACS Publications; Feb. 27, 2012; pp. 1538-1544.
Min et al.; Nanosheet thickness-modulated MoS2 dielectric property evidenced by field-effect transistor performance; The Royal Society of Chemistry; Dec. 3, 2012; 2 pp.
MoS 2 Nanosheets for Top-Gate Nonvolatile Memory Transistor Channel; Sung Lee et al.; Small 2012,8, No. 20, pp. 3111-3115.
Nonvolatile ferroelectric-gate field-effect transistors using SrBi2Ta2O9/Pt/SRTa2O6/SiON/Si structures; E. Tokumitsu; Applied Physics Letters, vol. 75, No. 4; Jul. 26, 1999; pp. 575-577.
Pandey et al., "Structural, ferroelectric and optical properties of PZT thin films", 2005, Physica B, vol. 368, Nov. 2005; pp. 135-142.
R.S. Lous; Ferroelectric Memory Devices, How to store information of the future; Top Master Programme in Nanoscience; Jul. 2011; 23 pp.
Recent Progress of Ferroelectric-Gate Field-Effect Transistors and Applications to Nonvolatile Logic and FeNAND Flash Memory; Sakai et al.; Materials 2010, 3, Nov. 18, 2010; pp. 4950-4964.
Robertson, "Band offsets of wide-band-gap oxides and implications for future electronic devices"; J. Vac. Sci. Technol., B 18(3); May 2000; pp. 1785-1791.
Single-layer MoS2 transistors; Radisavijevic et al.; Nature Nanotechnology; vol. 6; Mar. 2011; pp. 147-150.

(56) References Cited

OTHER PUBLICATIONS

W. Liu et al.; Role of Metal Contacts in Designing High-Performance Monolayer n-Type WSe2 Field Effect Transistors; NANO Letters; ACS Publications; Mar. 25, 2013; pp. 1983-1990.
Zhang et al.; Ambipolar MoS2 thin Flake Transistors; NANO Letters; ACS Publications; Jan. 25, 2012; pp. 1136-1140.
Pontes, et al.; Synthesis, optical and ferroelectric properties of PZT thin films: experimental and theoretical investigation; J. Mater. Chem vol. 22; 2012; pp. 6587-6596.
Rotaru et al.; Amorphous Phase Influence on the Optical Bandgap of Polysilicon; phys. stat. sol. (a) 171; 1999; pp. 365-370.

* cited by examiner

ARRAY OF CROSS POINT MEMORY CELLS INDIVIDUALLY COMPRISING A SELECT DEVICE AND A PROGRAMMABLE DEVICE

TECHNICAL FIELD

Embodiments disclosed herein pertain to arrays of cross point memory cells and to methods of forming an array of cross point memory cells.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. One type of capacitor is a ferroelectric capacitor which has ferroelectric material as at least part of the insulating material. Ferroelectric materials are characterized by having two stable polarized states and thereby can comprise programmable material of a memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. One type of memory cell has a select device electrically coupled in series with a ferroelectric capacitor.

Another type of non-volatile memory is phase change memory. Such memory uses a reversibly programmable material that has the property of switching between two different phases, for example between an amorphous disorderly phase and a crystalline or polycrystalline orderly phase. The two phases may be associated with resistivities of significantly different values. Presently, typical phase change materials are chalcogenides, although other materials may be developed. With chalcogenides, the resistivity may vary by two or more orders of magnitude when the material passes between the amorphous (more resistive) phase and the crystalline (more conductive) phase. Phase change can be obtained by locally increasing the temperature of the chalcogenide. Below 150° C., both phases are stable. Starting from an amorphous state and rising to temperature above about 400° C., a rapid nucleation of crystallites may occur and, if the material is kept at the crystallization temperature for a sufficiently long time, it undergoes a phase change to become crystalline. Reversion to the amorphous state can result by raising the temperature above the melting temperature (about 600° C.) followed by cooling.

Other reversibly programmable materials for memory cells exist and undoubtedly will be developed.

DETAILED DESCRIPTION OF EXAMPLE EMBODIMENTS

Figure 1:
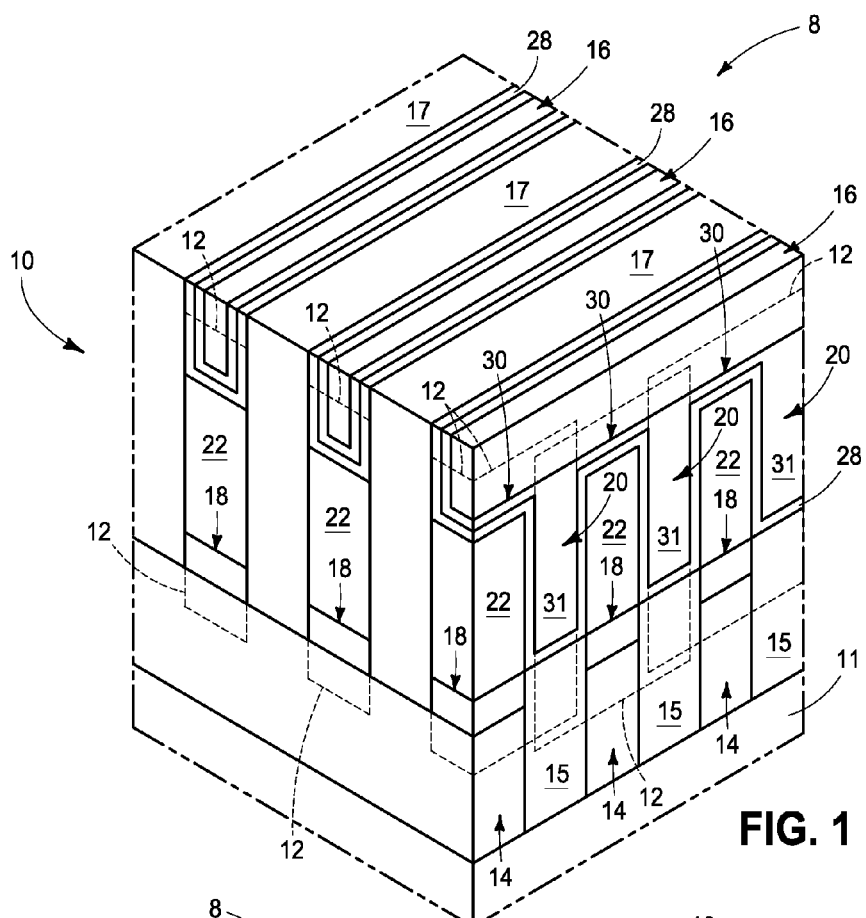
FIG. 1 is a diagrammatic isometric view of a substrate fragment comprising a portion of an array of cross point memory cells in accordance with an embodiment of the invention.
Figure 2:
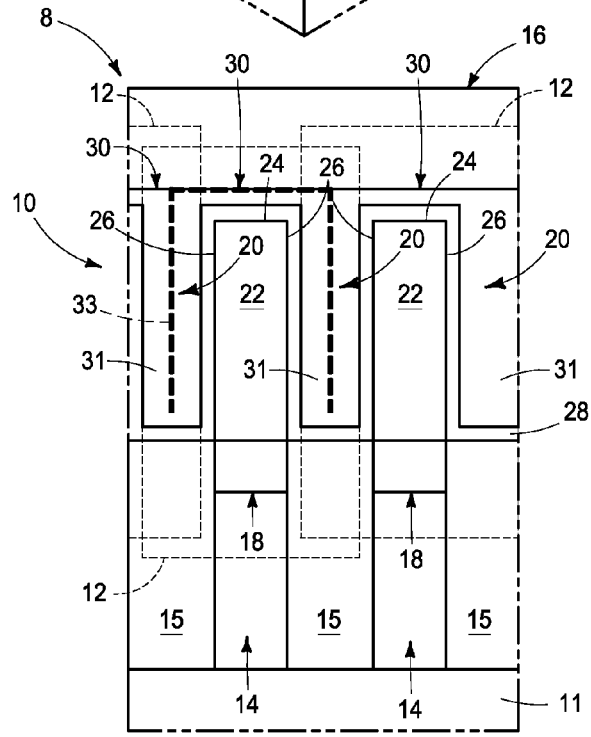
FIG. 2 is an enlarged side-elevational view of a portion of the FIG. 1 substrate.

Embodiments of the invention encompass an array of cross point memory cells and methods of forming an array of cross point memory cells. FIGS. 1 and 2 show a small portion of a substrate construction 8 comprising an array 10 of individual cross point memory cells 12 that has been fabricated relative to a base substrate 11. Substrate 11 may comprise any one or more of conductive (i.e., electrically herein), semiconductive, or insulative/insulator (i.e., electrically herein) materials. Various materials have been formed elevationally over base substrate 11. In this document, "elevational", "upper", "lower", "top", "bottom", and "beneath" are generally with reference to the vertical direction. "Horizontal" refers to a general direction along a primary surface relative to which the substrate is processed during fabrication, and vertical is a direction generally orthogonal thereto. Further, "vertical" and "horizontal" as used herein are generally perpendicular directions relative one another and independent of orientation of the substrate in three-dimensional space. Example outlines of immediately adjacent individual memory cells 12 are shown as being elevationally staggered for ease of depiction in the Figures where, for example, such memory cells in some embodiments overlap and/or share some component(s).

Materials may be aside, elevationally inward, or elevationally outward of the FIG. 1—depicted materials. For example, other partially or wholly fabricated components of integrated circuitry may be provided somewhere above, about, or within fragment 11. Control and/or other peripheral circuitry for operating components within the memory array may also be fabricated, and may or may not wholly or partially be within a memory array or sub-array. Further, multiple sub-arrays may also be fabricated and operated independently, in tandem, or otherwise relative one another. As used in this document, a "sub-array" may also be considered as an array. Regardless, any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Array 10 comprises spaced lower first lines 14 and spaced upper second lines 16 which cross first lines 14, with individual memory cells 12 being between first lines 14 and second lines 16 where such cross. Reference to "first" and "second" with respect to different components herein is only for convenience in description in referring to different components. Accordingly, "first" and "second" may be interchanged independent of relative position within the finished circuit construction and independent of sequence in fabrication. Lines 14 and 16 comprise conductive material, with examples being elemental metals, a mixture or alloy of two or more elemental metals, conductive metal compounds, and conductively-doped semiconductive materials. Lines 14 and 16 may be of the same composition or of different compositions relative one another. In one embodiment, first lines 14 and second lines 16 angle orthogonally relative one another. In one embodiment, lines 14 are access or word lines and lines 16 are sense or bit lines. Dielectric material 15 is between individual first lines 14.

Individual memory cells 12 comprise a select device 18 and a programmable device 20 in series (i.e., electrical) with each other. Select device 18 is proximate (e.g., more so than is the programmable device) and electrically coupled to one of first lines 14 or one of second lines 16. Programmable device 20 is proximate (e.g., more so than is the select device) and electrically coupled to one of the other of a first line 14 or a second line 16. In one embodiment, select device 18 is directly electrically coupled to the one first or second line and in one embodiment programmable device 20 is directly electrically coupled to the one of the other first or second line. In this document, two electronic devices or components are "electrically coupled" to one another if in normal operation electric current is capable of continuously flowing from one to the other, and does so predominately by movement of subatomic positive and/or negative charges when such are sufficiently generated. Another electronic component may be between and electrically coupled to the two electrically coupled electronic components or devices. In contrast, when two electronic components or devices are referred to as being "directly electrically coupled", no intervening electronic component is between the two directly electrically coupled components or devices. In the FIG. 1 embodiment, select device 18 is proximate and directly electrically coupled to one of first lines 14 and programmable device 20 is proximate and directly electrically coupled to one of second lines 16. Any existing or yet-to-be developed select devices may be used, for example a junction device or a diode. Example diodes include PN diodes, PIN diodes, Schottky diodes, Zener diodes, avalanche diodes, tunnel diodes, diodes having more than three materials, etc. As an additional example, select device 18 may be a junction bipolar transistor. Select device 18 may include an elevationally outer and/or elevationally inner conductive material as a part thereof (not specifically shown).

Individual programmable devices 20 comprise a first electrode 22 in the form of a conductive pillar elevationally over one of first lines 14. In this document, a "pillar electrode" and a "conductive pillar" is a conductive structure that is of radially continuous conductive material(s) longitudinally along at least a majority of its length. First pillar electrode 22 comprises a top 24 and sidewalls 26 (FIG. 2). Any suitable conductive material(s) may be used for first pillar electrodes 22, with TiN being one example. Programmable material 28 is laterally outward of opposing sidewalls 26 of first pillar electrode 22, in one embodiment is elevationally over pillar top 24, and in one embodiment comprises a continuous layer extending over opposing sidewalls 26 and top 24 of individual first pillar electrodes 22. Any existing or yet-to-be-developed programmable material may be used, for example those described in the "Background" section above.

Programmable device 20 includes a second electrode 30 outward of the programmable material 28 that is laterally over opposing sidewalls 26 of first pillar electrode 22, and in one embodiment is elevationally over first pillar electrode top 24. Second electrode 30 may be of the same or different composition from that of first pillar electrode 22, and may be of the same or different composition from second lines 16. In the depicted example, second electrode 30 is shown to be of different conductive composition than second lines 16. Regardless, second electrodes 30 may be considered as part of or an elevational extension of a conductive line 16. In one embodiment and as shown, the second electrodes 30 of immediately adjacent memory cells 12 along individual second lines 16 are directly electrically coupled to one another. For example in one embodiment, second electrodes 30 are shown as comprising conductive pillars 31, with immediately adjacent memory cells 12 sharing one of conductive pillars 31. Regardless, in one embodiment programmable material 28 is beneath second electrode 30 between two immediately adjacent first lines 14. Further in one embodiment, programmable material 28 is continuous over multiple tops 24 and sidewalls 26 of multiple first pillar electrodes 22, and beneath multiple second electrodes 30 between immediately adjacent first lines 14. In one embodiment, first pillar electrode 22 has a maximum conductive material width that is greater than that of conductive pillar 31 laterally proximate the programmable material that is laterally outward of one of opposing sidewalls 26 of first pillar electrode 22. In one embodiment, first pillar electrode 22 has a maximum conductive material volume that is greater than that of conductive pillar 31. Regardless, in one embodiment programmable device 20 is a ferroelectric capacitor with programmable material 28 thereby comprising ferroelectric material.

The first pillar electrode or the second electrode is electrically coupled to the select device (in one embodiment directly electrically coupled) and the other of the first pillar electrode or the second electrode is electrically coupled (in one embodiment directly electrically coupled) to one of the first or second lines. In the depicted embodiment where select device 18 is proximate and electrically coupled to a first line 14, first pillar electrode 22 is elevationally over and electrically coupled to select device 18. Second electrode 30 is electrically coupled to one of second lines 16, and again may be considered as comprising a part thereof. In one embodiment and as shown, second electrode 30 is of an upside-down U-shape 33 in cross-section along its overlying second line 16, for example as readily viewable in FIG. 2 (only one U-shape shape 33 being shown for one second electrode 30 of one memory cell 12 in FIG. 2 for clarity).

FIGS. 1 and 2 show an example embodiment where second lines 16 may have been formed in a self-aligned manner within trenches that were also formed in a self-aligned manner in conductive material of second electrodes 30, and for example as will be described below. Thereby, and for example where second lines 16 and second electrodes 30 are of different conductive compositions, material of second electrodes 30 is shown extending along sidewalls of second lines 16. Additionally as an example and as shown, programmable material 28 also extends along sidewalls of second lines 16 laterally outward of the second electrode conductive material. In this document, "self-aligned" means a technique whereby at least a lateral surface of a structure is defined by deposition of material against a sidewall of a previously patterned structure. Dielectric material 17 is between immediately adjacent second lines 16.

Figure 3:
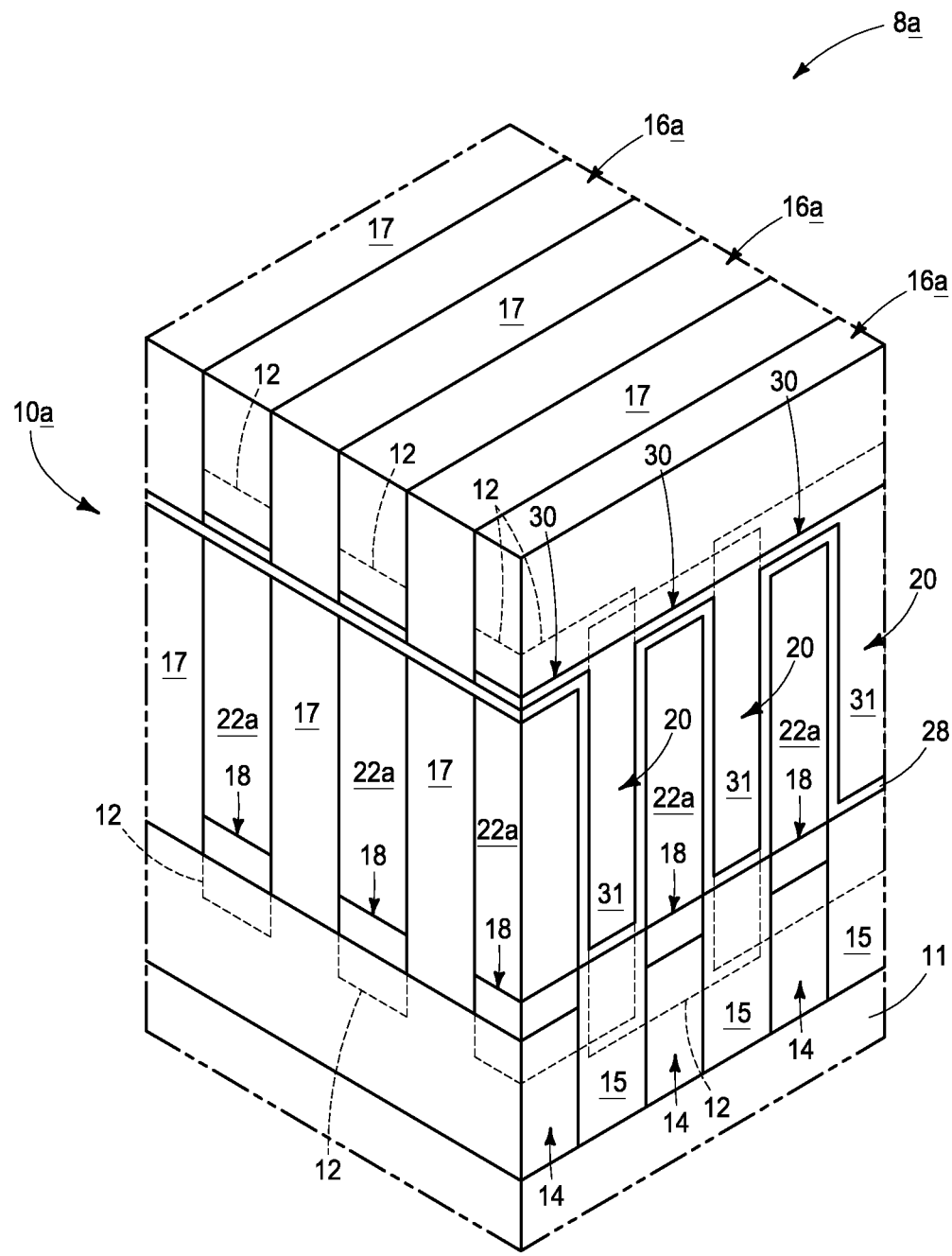
FIG. 3 is a diagrammatic isometric view of a substrate fragment comprising a portion of an array of cross point memory cells in accordance with an embodiment of the invention.

FIG. 3 shows an example alternate embodiment construction 8a of an array 10a that may be produced, for example, from subtractive patterning of conductive material of second lines 16a. Like numerals from the above-described embodiments have been used where appropriate, with some construction differences being indicated with the suffix "a". In the FIG. 3 example, programmable material 28 and conductive material of second electrodes 30 do not extend along sidewalls of second lines 16, and pillar electrodes 22a are shown taller than pillar electrodes 22 (FIGS. 1 and 2). Any other attribute(s) or aspect(s) as described above and/or shown in FIGS. 1 and 2 may be used in the FIG. 3 embodiments.

Figure 4:
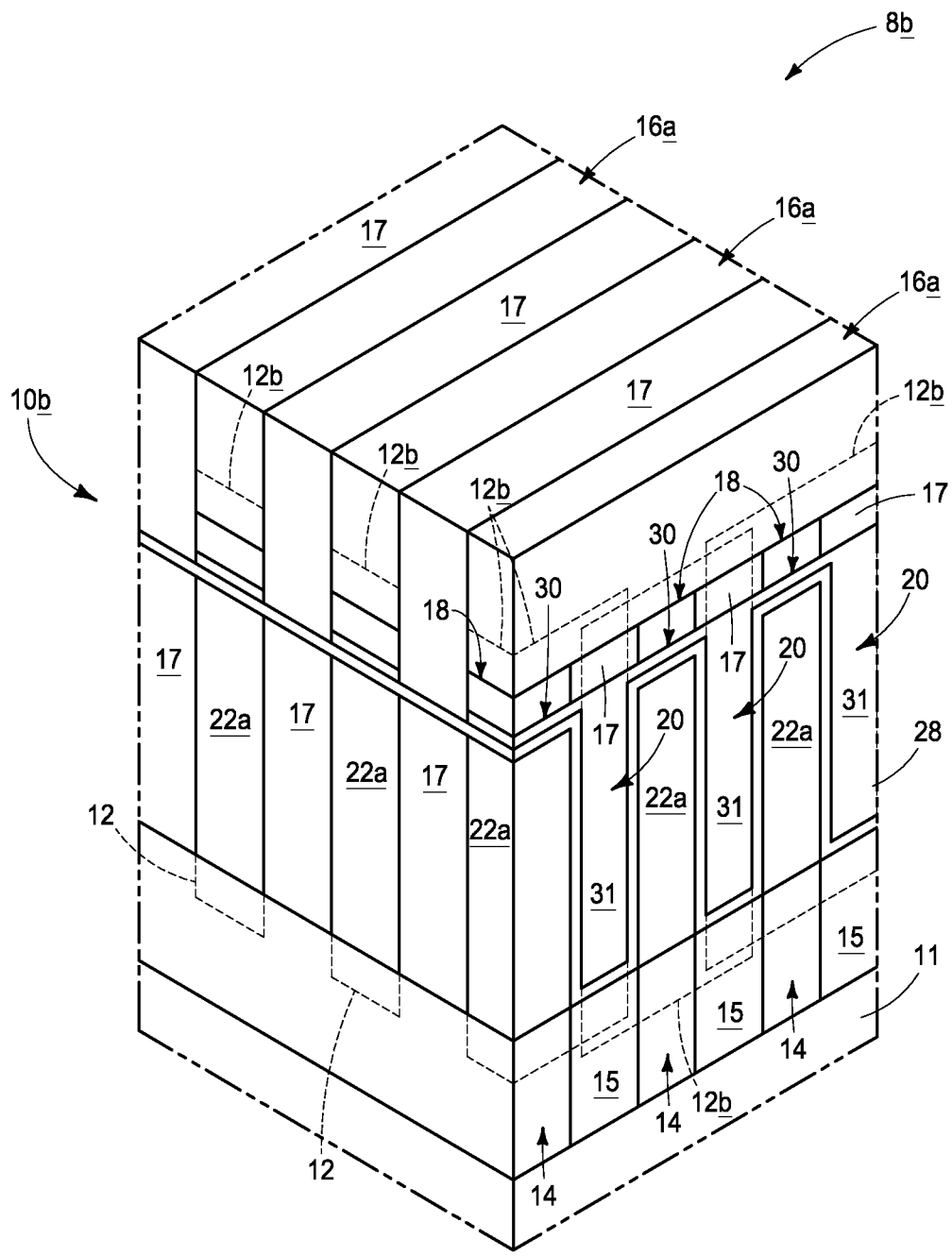
FIG. 4 is a diagrammatic isometric view of a substrate fragment comprising a portion of an array of cross point memory cells in accordance with an embodiment of the invention.

FIG. 4 shows another alternate embodiment construction 8b to that shown in FIG. 3. Like numerals from the above-described embodiments have been used where appropriate, with some construction differences being indicated with the suffix "b". In array 10b, a memory cell 12b has select device 18 proximate (e.g., more so than is the programmable device) and electrically coupled to one of second lines 16. Programmable device 20 is proximate (e.g., more so than is the select device) and electrically coupled to one of first lines 14. Accordingly, first pillar electrode 22a is elevationally over, proximate, and electrically coupled (e.g., directly) to one first line 14 and second electrode 30 is electrically coupled (e.g., directly) to one select device 18. Construction analogous to that shown in FIG. 4 can also of course be used in the construction of FIGS. 1 and 2 whereby the select device is provided between a second line 16a and a second electrode 30 (not shown). Any other attribute(s) or aspect(s) as described above and/or shown in FIGS. 1-3 may be used in the FIG. 4 embodiments.

Figure 5:
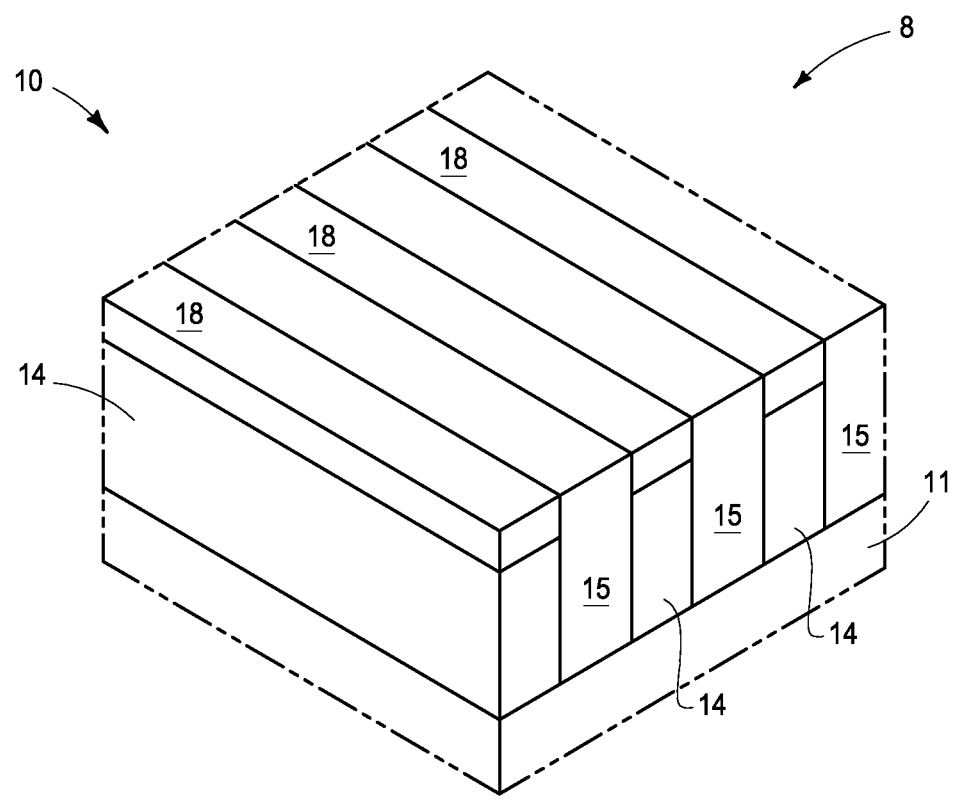
FIG. 5 is a diagrammatic isometric view of a predecessor substrate to that of FIG. 1 in process in accordance with an embodiment of the invention.

Embodiments of the invention encompass methods of forming an array of cross point memory cells and example embodiments of which are next described initially with reference to FIGS. 5-14. Like numerals from the above-described embodiments for like materials of construction have been used where appropriate, with some construction differences being indicated with different numerals. FIGS. 5-14 show an example embodiment for fabrication of the FIGS. 1 and 2 array (bottom-formed select device) from a predecessor construction 8, although a top-formed select device method may alternately be used. FIG. 5 shows an example wherein select device material 18 has been patterned commensurate with the patterning of first lines 14, and dielectric material 15 is between first lines 14. Only some of the thickness of select device material 18 may be patterned depending on the type of select devices being formed. Any of the depicted patternings herein may use masking steps, for example photolithographic or other patterning and, regardless, which may use pitch multiplication.

Figure 6:
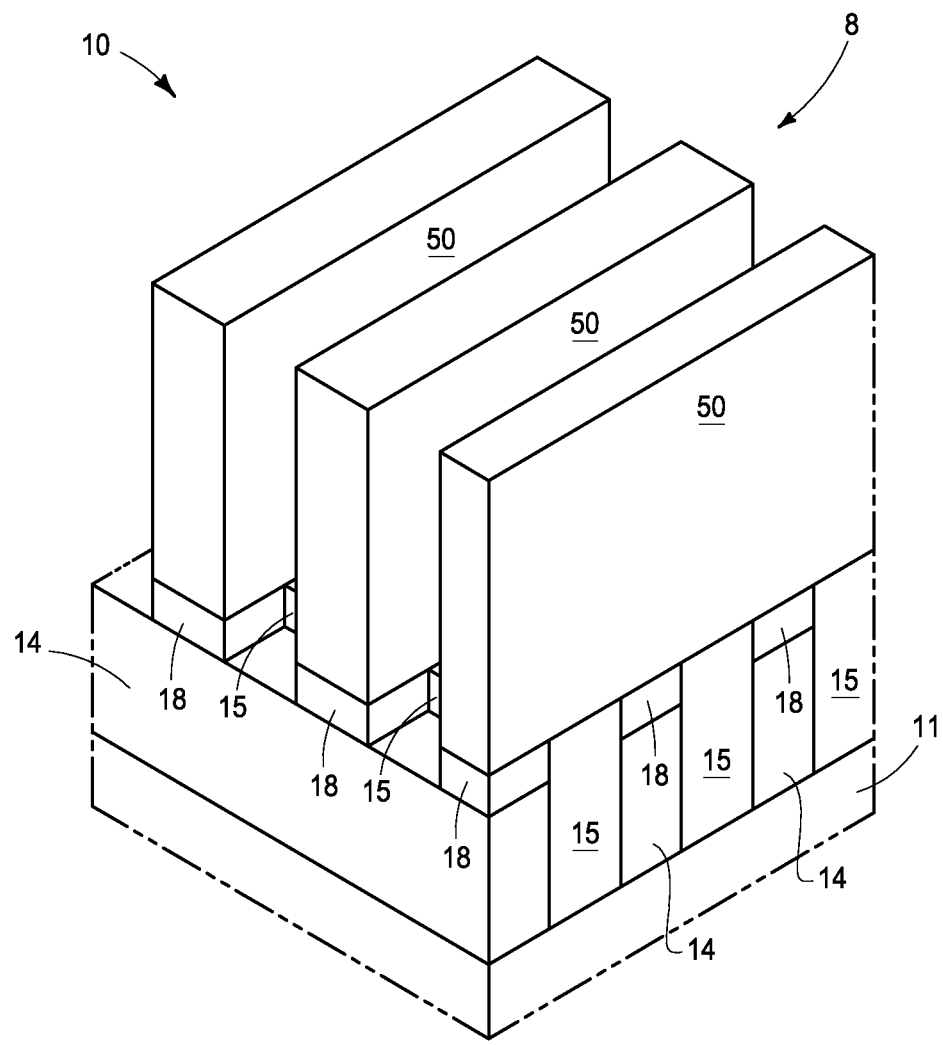
FIG. 6 is a view of the FIG. 5 substrate at a processing step subsequent to that shown by FIG. 5.

Referring to FIG. 6, dielectric material 50 has been formed over the substrate of FIG. 5, and has been patterned and used as a mask to form rails of material 50 that run along the second line-direction and to complete patterning of select device material 18. In one embodiment, dielectric material 50 is of different composition (e.g., silicon dioxide) from that of dielectric material 15 (e.g., silicon nitride), and an etch of select device material 18 is conducted selectively relative to dielectric materials 50 and 15. In this document, a selective etch or removal is an etch or removal where one material is removed relative to another stated material at a rate of at least 1.5:1.

Figure 7:
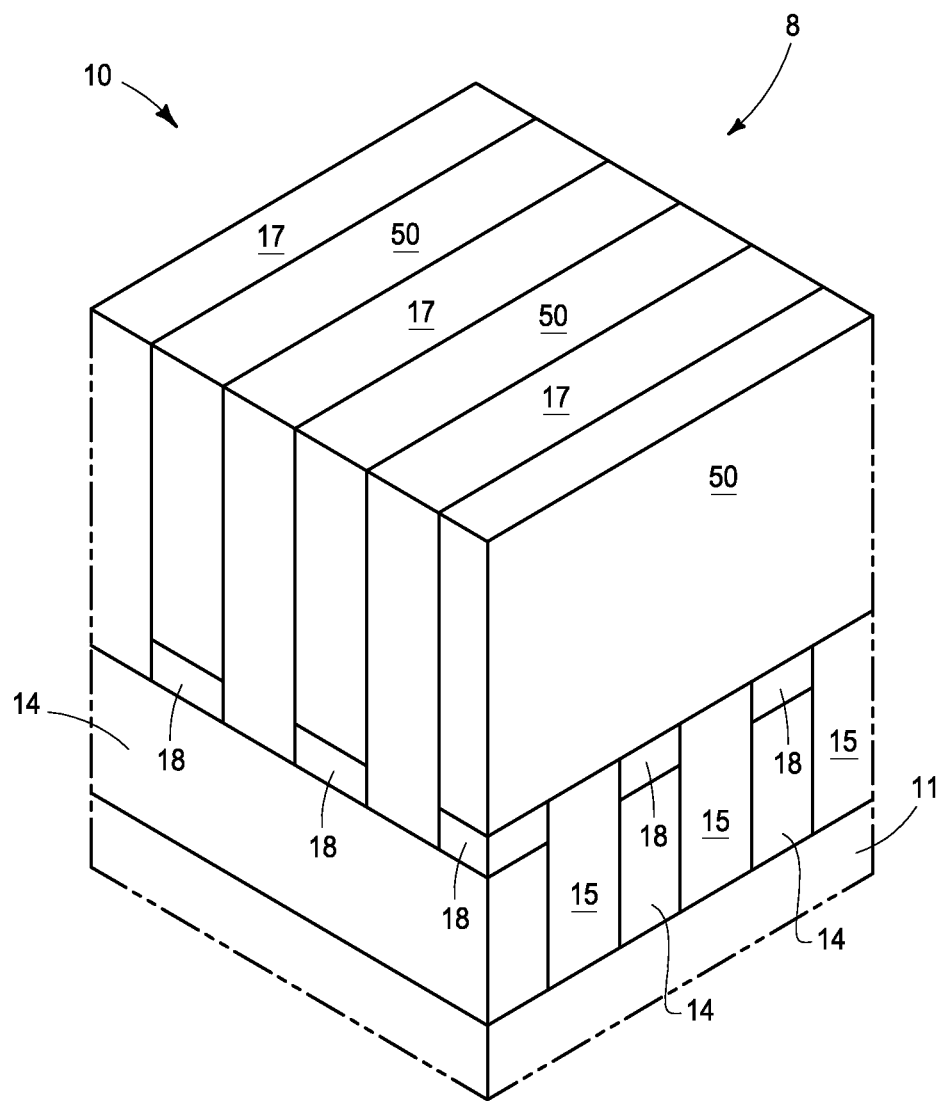
FIG. 7 is a view of the FIG. 6 substrate at a processing step subsequent to that shown by FIG. 6.

Referring to FIG. 7, dielectric material 17 has been deposited to fill space between the rails of material 50 in FIG. 6, with material 17 then being planarized back at least to elevationally outermost surfaces of material 50. In one embodiment, materials 50 and 17 are of different compositions relative one another, for example with material 50 comprising silicon dioxide and material 17 comprising silicon nitride.

Figure 8:
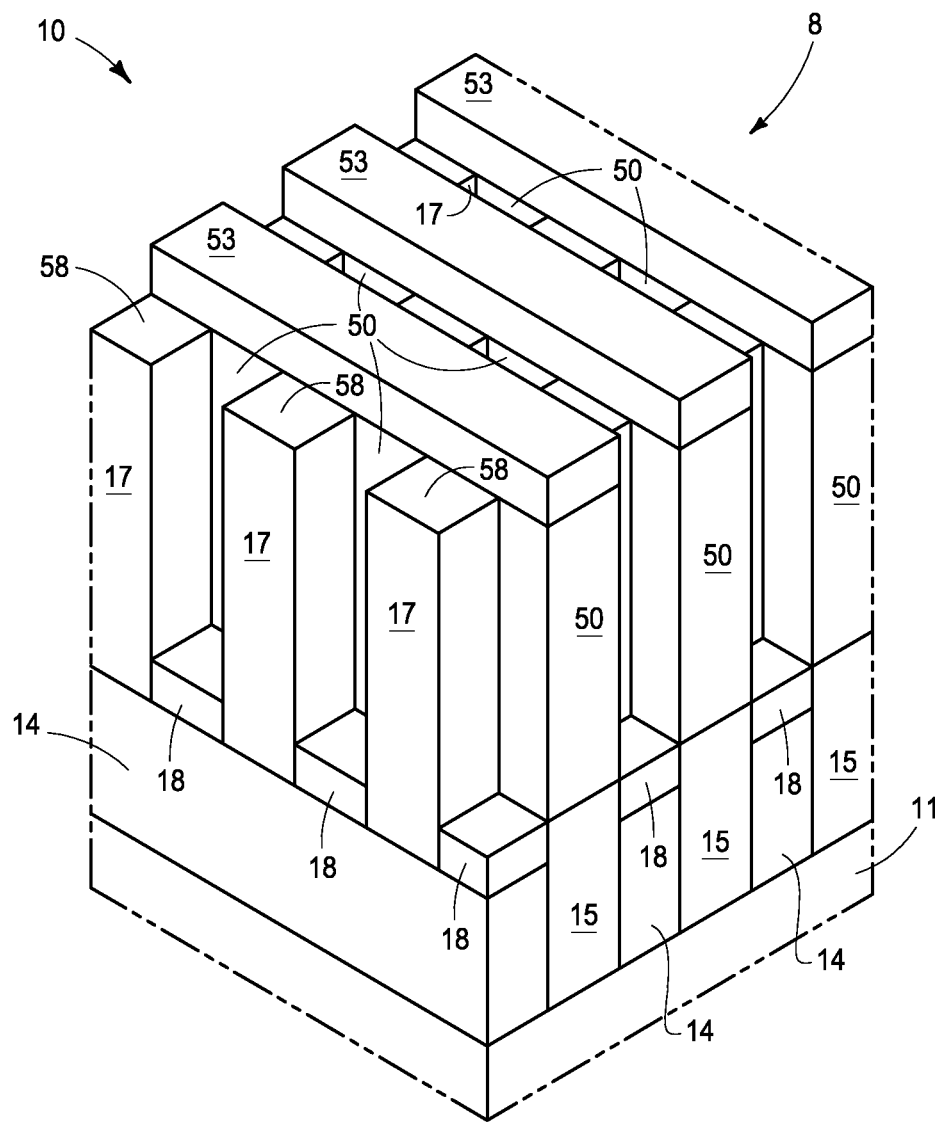
FIG. 8 is a view of the FIG. 7 substrate at a processing step subsequent to that shown by FIG. 7.
Figure 9:
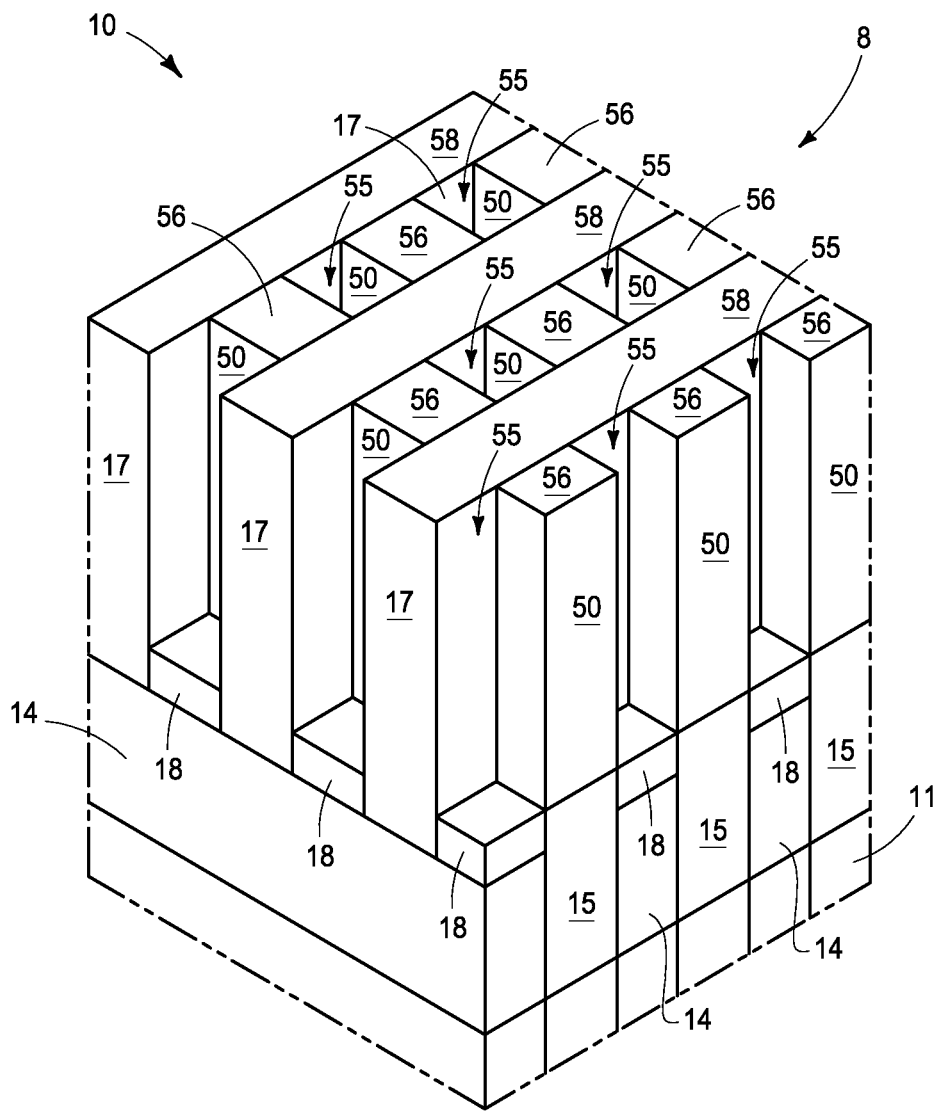
FIG. 9 is a view of the FIG. 8 substrate at a processing step subsequent to that shown by FIG. 8.

Referring to FIG. 8, mask lines 53 have been formed over the substrate of FIG. 7 elevationally over the spaces between first lines 14, and then unmasked material 50 has been anisotropically etched selectively relative to mask lines 53, dielectric material 17, and exposed select device material 18. Mask lines 53 are shown as having been removed in FIG. 9. Such processing results in the formation of first spaced openings 55 longitudinally along and elevationally over spaced lower first lines 14 (regardless of presence of select device material 18). First openings 55 are between first opposing walls 56 (e.g., material 50) that are between first lines 14 and are between second opposing walls 58 (e.g., material 17) that are along and cross elevationally over first lines 14.

Figure 10:
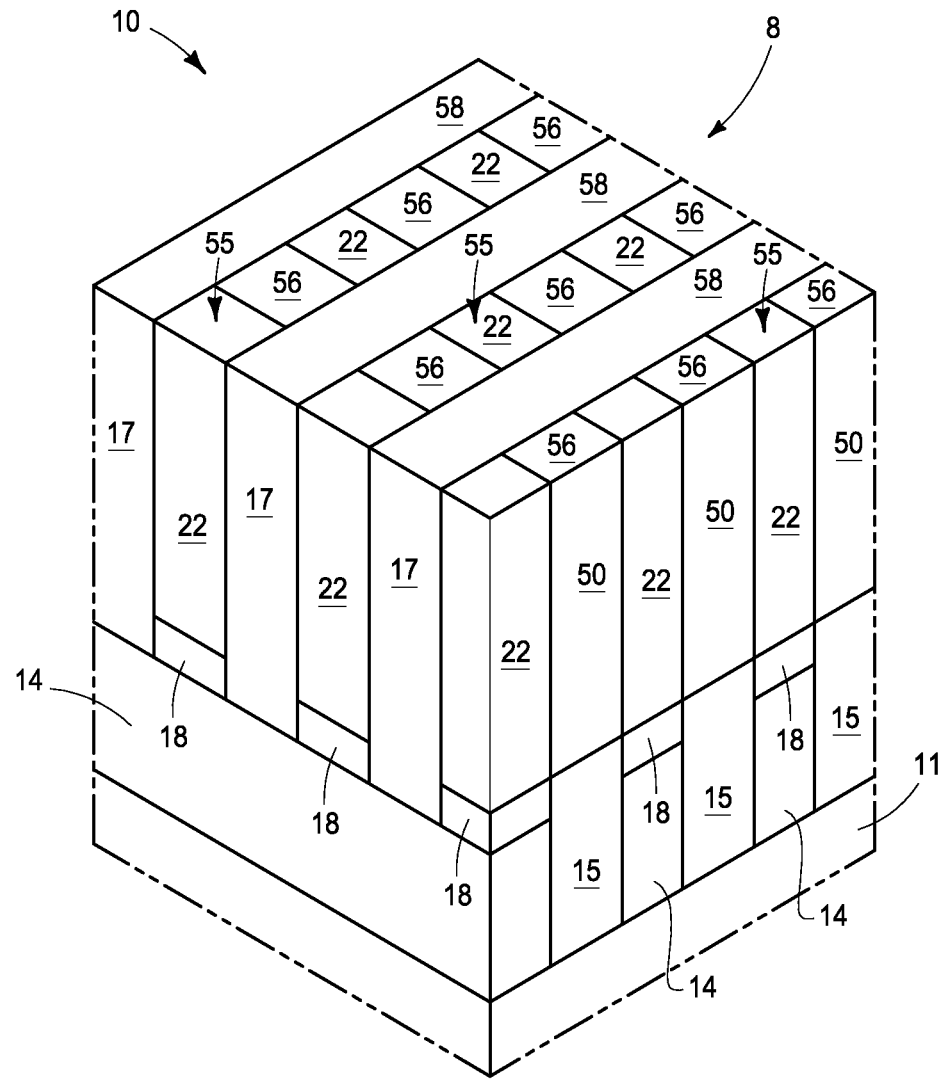
FIG. 10 is a view of the FIG. 9 substrate at a processing step subsequent to that shown by FIG. 9.

Referring to FIG. 10, conductive lower electrode pillar material 22 has been formed within individual of first openings 55 for individual of the memory cells.

Figure 11:
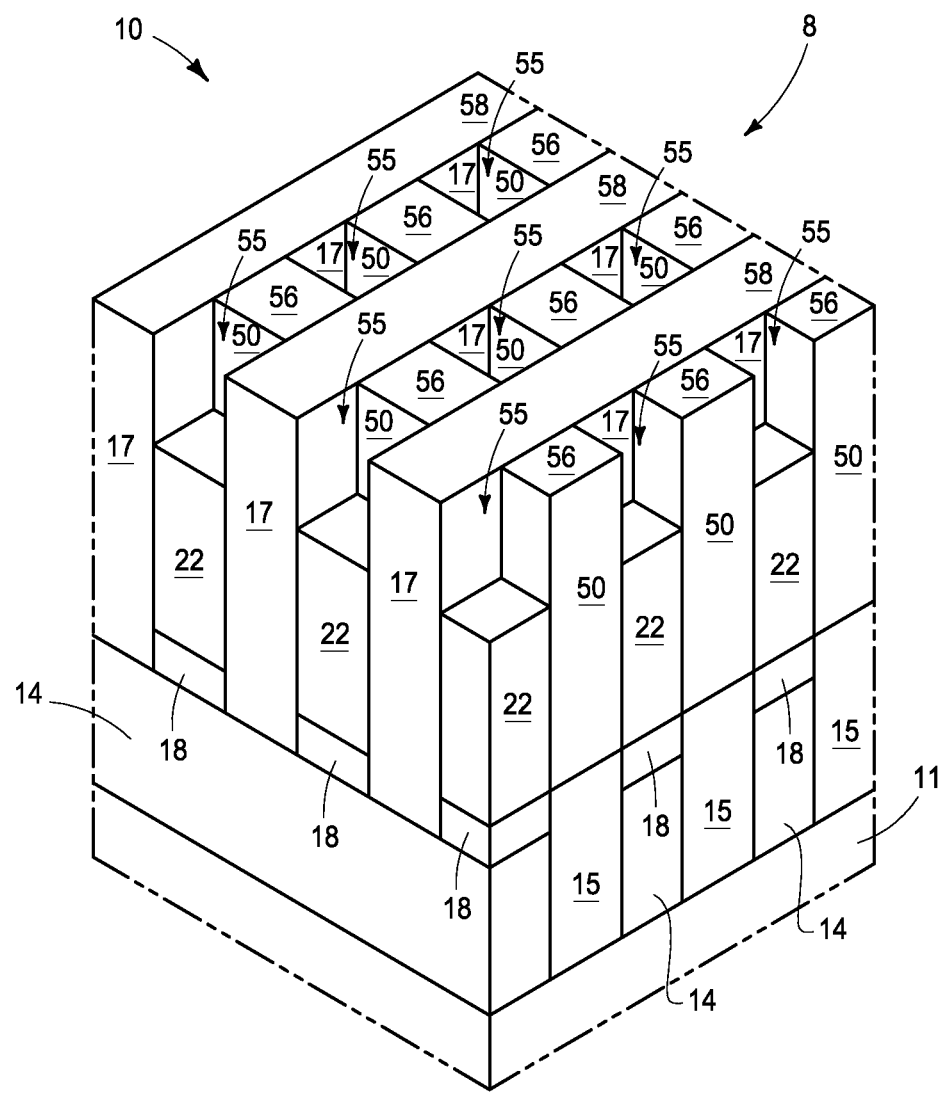
FIG. 11 is a view of the FIG. 10 substrate at a processing step subsequent to that shown by FIG. 10.

Referring to FIG. 11, and in one embodiment, conductive lower electrode pillar material 22 has been elevationally recessed within first openings 55, for example by a timed etch of pillar material 22 conducted selectively relative to material(s) of walls 56 and 58.

Figure 12:
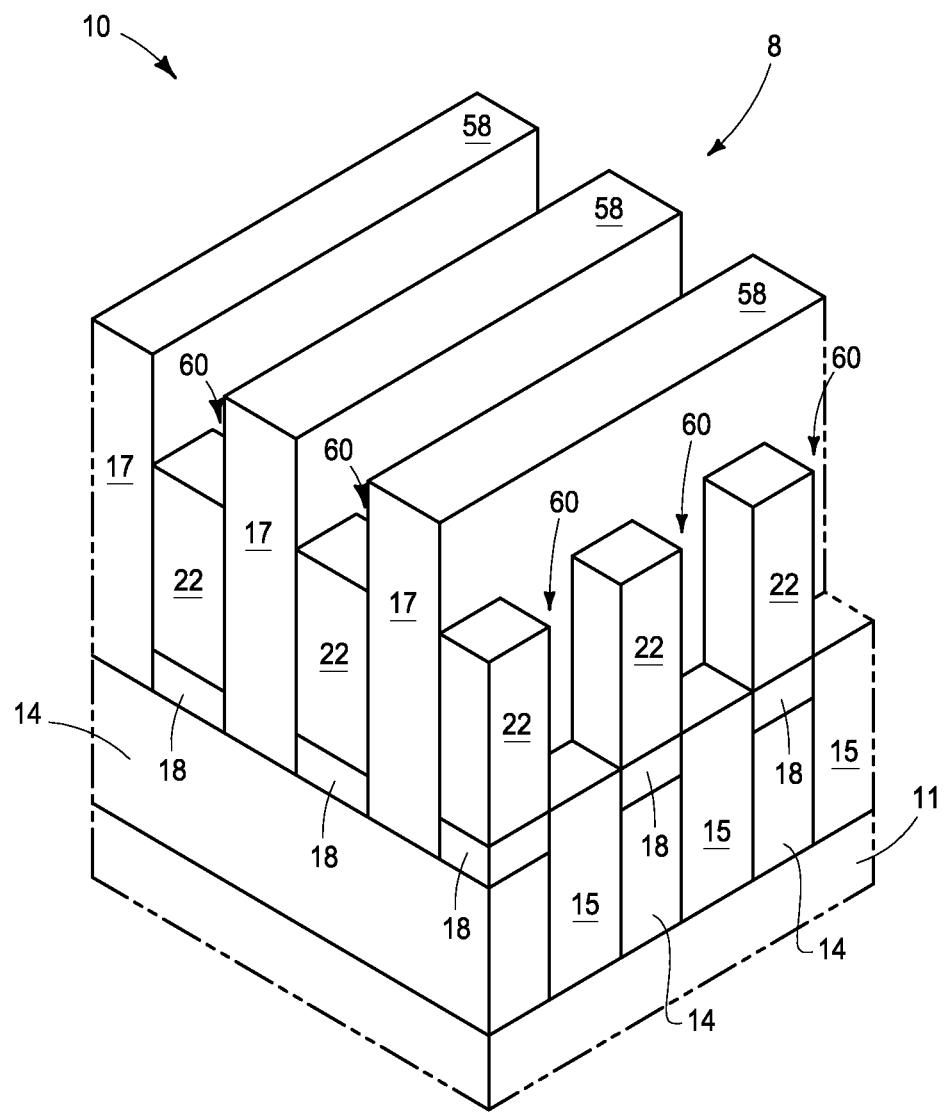
FIG. 12 is a view of the FIG. 11 substrate at a processing step subsequent to that shown by FIG. 11.

Referring to FIG. 12, first opposing walls 56 (not shown) have been removed to form second spaced openings 60 between first lines 14, with second openings 60 being between second opposing walls 58 and pillar electrodes 22. In one embodiment where, for example, walls 56 and 58 are of different compositions, such may be conducted by a selective etch of walls 56 (not shown) relative to walls 58 and conductive material of pillars 22. Where pillar electrodes 22 are elevationally recessed, such recessing may be conducted before and/or after removing first opposing walls 56.

The above processing is but one example method of forming spaced lower electrode pillars 22 for individual of the memory cells being formed along and elevationally over spaced lower first lines 14. Walls 58 cross elevationally over first lines 14 and between pillar electrodes 22 that are along first lines 14, with pillars 22 and walls 58 forming spaced openings 60 between first lines 14. Other techniques may be used, and with or without any recessing of the pillar electrodes.

Figure 13:
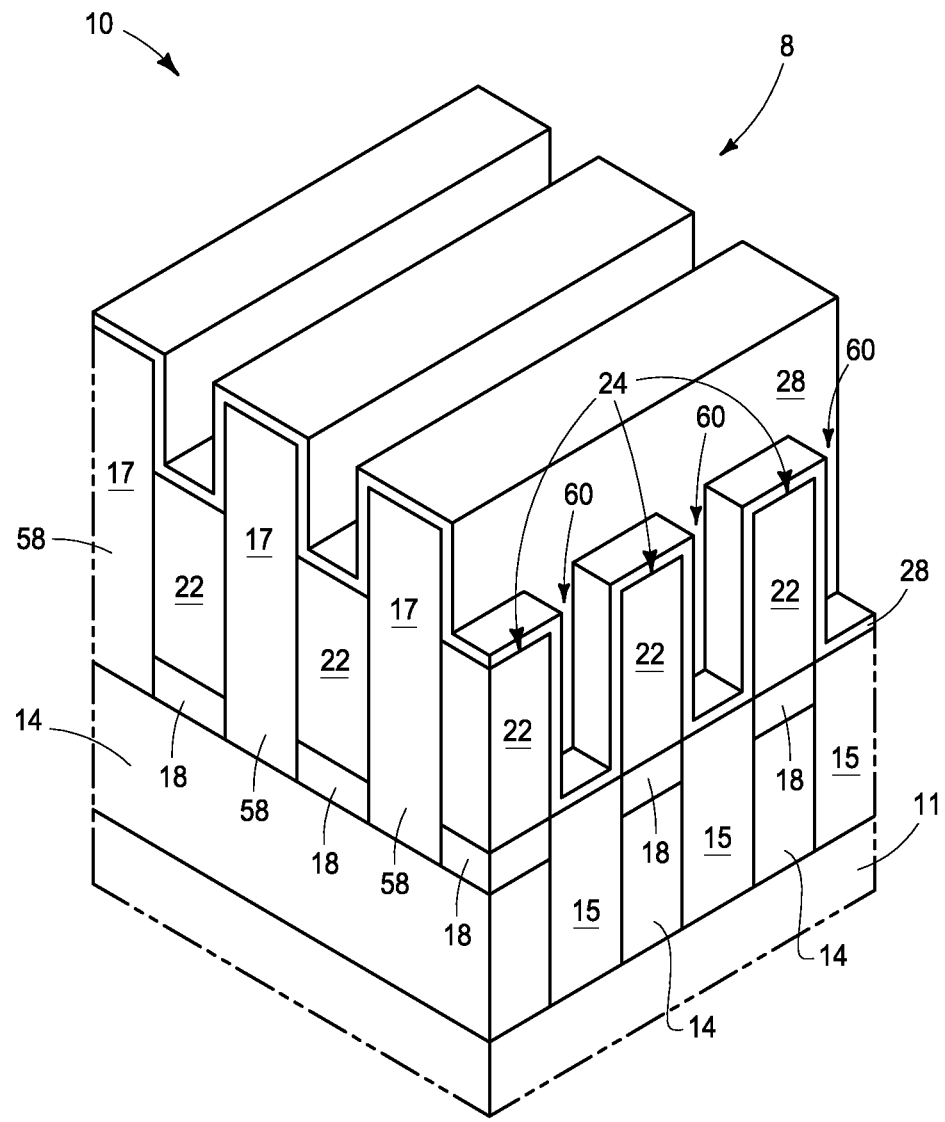
FIG. 13 is a view of the FIG. 12 substrate at a processing step subsequent to that shown by FIG. 12.

Referring to FIG. 13, openings 60 have been lined with programmable material 28 to less-than-fill openings 60 with programmable material 28, and regardless of whether first openings are ever formed. In one embodiment and as shown, programmable material 28 is formed over pillar electrode tops 24 and remains in a finished construction of the array (e.g., FIGS. 1 and 2).

Figure 14:
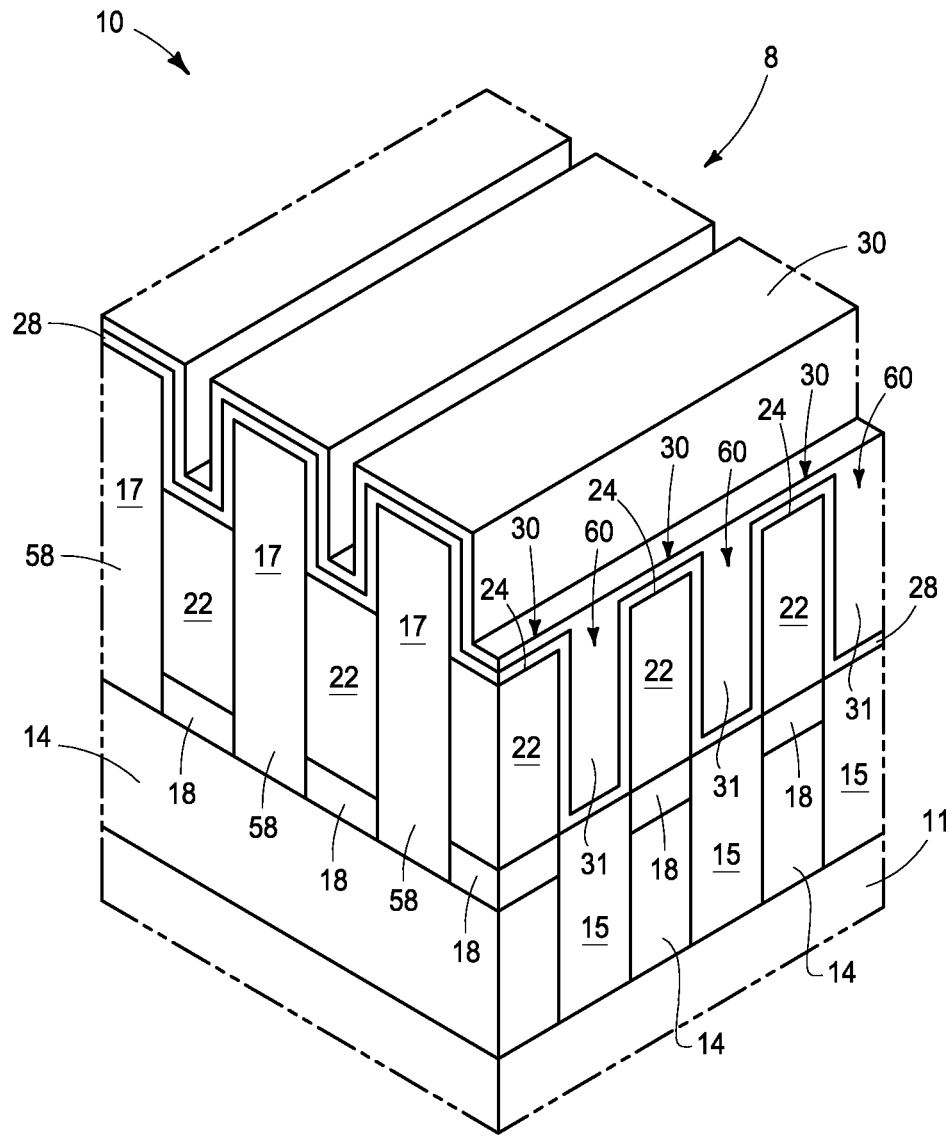
FIG. 14 is a view of the FIG. 13 substrate at a processing step subsequent to that shown by FIG. 13.

Referring to FIG. 14, conductive upper electrode material 30 has been formed over programmable material 28 within remaining volume of openings 60, in one embodiment to fill all of the remaining volume of openings 60, and in one embodiment as shown to overfill all of the remaining volume of openings 60, thereby forming conductive pillars 31 of second electrodes 30. Accordingly and in one embodiment as shown, conductive upper electrode material 30 has also been formed elevationally over programmable material 28 that is over conductive pillar tops 24, and remains in the finished circuitry construction. Upper second line material 16 can then be deposited and planarized back at least to elevationally outermost surfaces of walls 58, for example to produce a construction as shown in FIGS. 1 and 2 (e.g., in a self-aligned manner). Alternately as an example, second electrode material 30 and conductive lines 16 may be deposited as a single, continuous, homogenous conductive material composition, with material 16 thereby forming or constituting part of second electrodes 30 (not shown) (e.g., also in a self-aligned manner). Regardless, in one embodiment masking steps are used in the formation of the array of cross point memory cells. FIGS. 5-14 (including FIGS. 1 and 2) show an example method of forming all of spaced first lines 14, pillar electrodes 22, spaced second lines 16, and select devices 18 (and in one embodiment first openings 55) using only three masking steps, namely a masking step to produce the FIG. 5 construction, a masking step to produce the FIG. 6 construction, and the masking step of FIG. 8.

Figure 15:
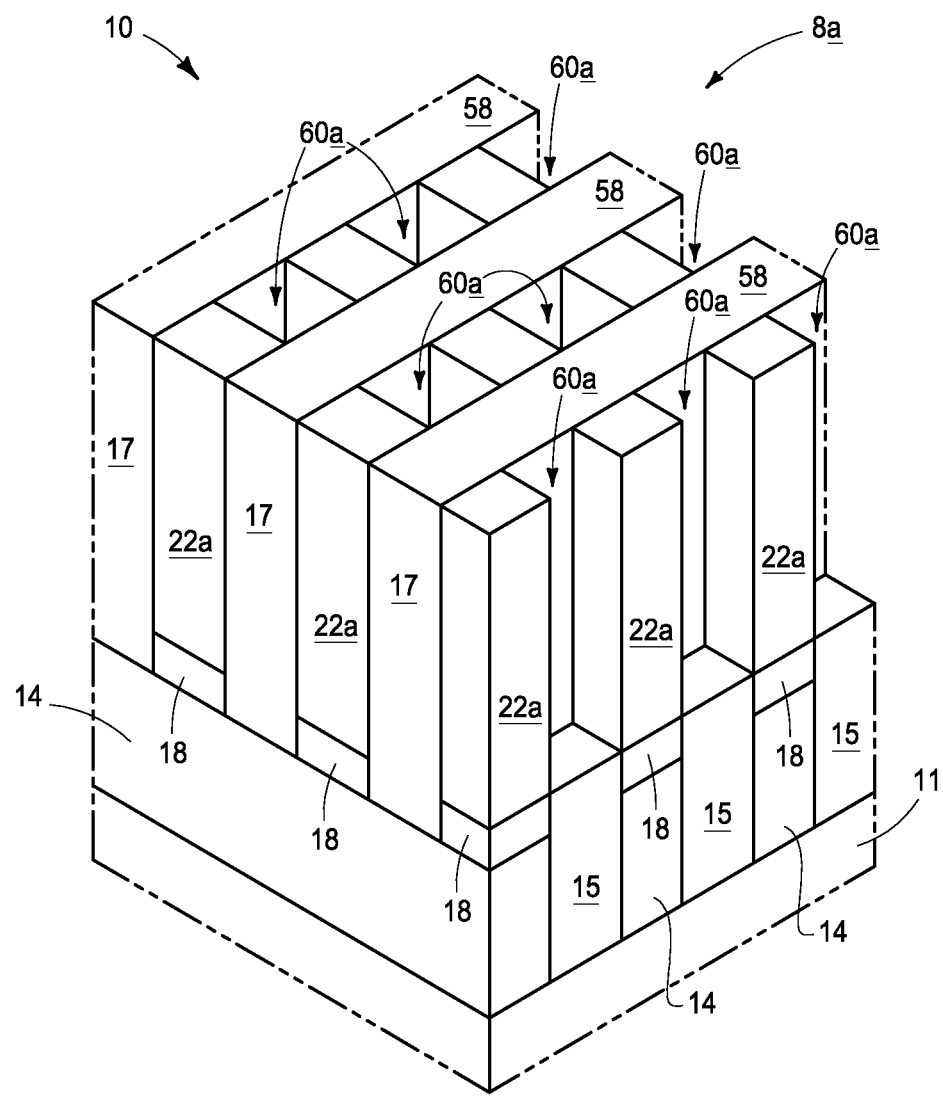
FIG. 15 is a diagrammatic isometric view of a predecessor substrate to that of FIG. 3 in process in accordance with an embodiment of the invention.

An alternate example embodiment method for producing the construction of FIG. 3 is described with reference to FIGS. 15 and 16 with respect to a predecessor construction 8a. Like numerals from the above-described method embodiments have been used where appropriate, with some construction differences being indicated with the suffix "a". FIG. 15 shows processing conducted immediately after the processing that produced the substrate of FIG. 10 in the above-described method embodiments. Specifically, first opposing walls 56 (not shown) have been removed to form openings 60a (e.g., without recessing of pillar electrodes 22a).

Figure 16:
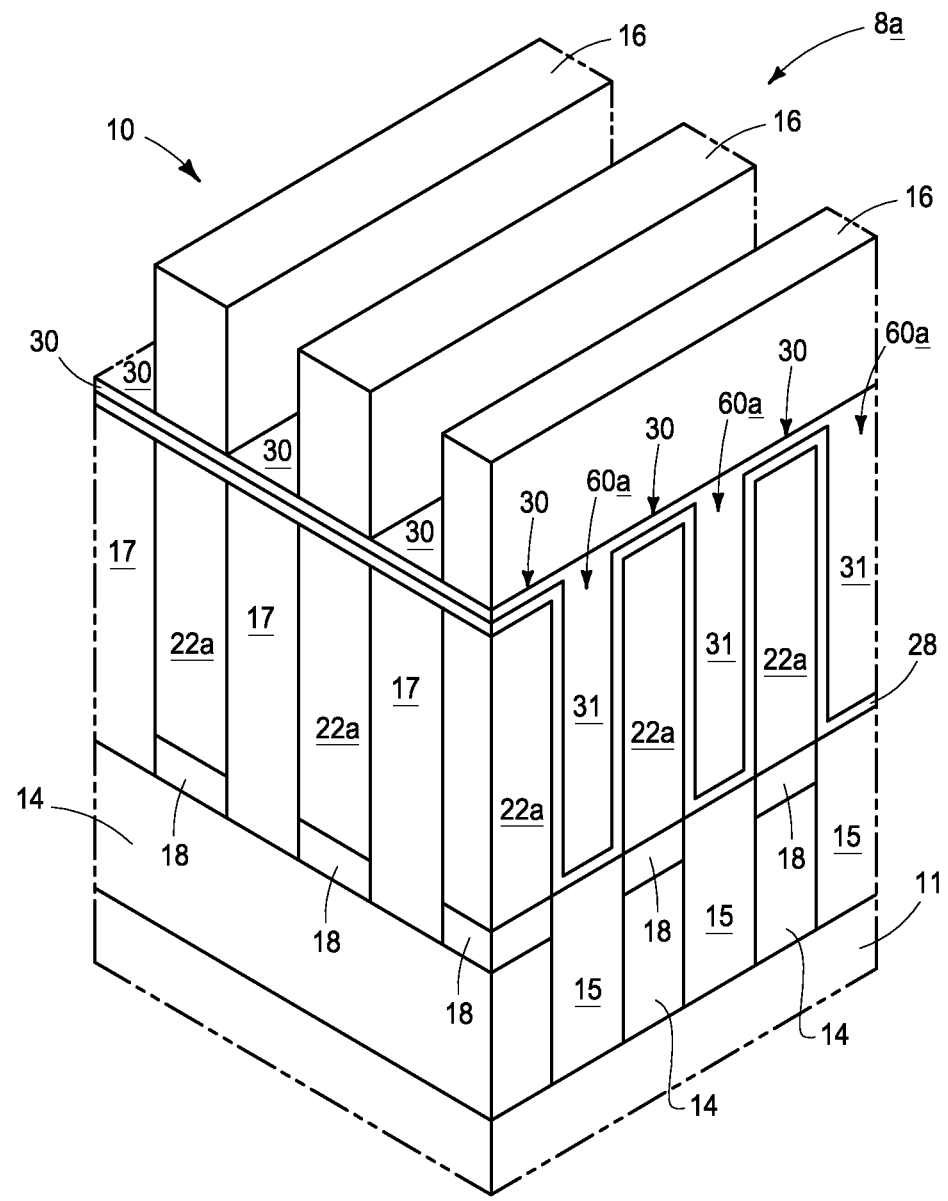
FIG. 16 is a view of the FIG. 15 substrate at a processing step subsequent to that shown by FIG. 15.

Referring to FIG. 16, programmable material 28 has been deposited to line openings 60a to less-than-fill such openings, followed by formation of upper electrode material 30 within remaining volume of openings 60a. Conductive material 16 for the second lines has been deposited and patterned there-over. Such may then be used as masking during an anisotropic etch of outer electrode material 30 to isolate it along the second line-direction to produce a construction analogous to that shown in FIG. 3. Again as an example, the second line material 16 and the outer conductive electrode material 30 may alternately be deposited as a single composition deposition (or collectively as multiple compositions) and then collectively patterned together.

A select device is ultimately provided between the conductive lower electrode material and the underlying first line or provided between the conductive upper electrode material and the overlying second line for the individual memory cells. Any other attribute(s) or aspect(s) as described above and/or shown in FIGS. 1-4 of the structure embodiments may be used in the method embodiments.

CONCLUSION

In some embodiments, a method of forming an array of cross point memory cells comprises forming spaced lower electrode pillars for individual of the memory cells being formed along and elevationally over spaced lower first lines. Walls cross elevationally over the first lines and between the electrode pillars that are along the first lines. The electrode pillars and walls form spaced openings between the first lines. The openings are lined with programmable material of the memory cells being formed to less-than-fill the openings with the programmable material. Conductive upper electrode material is formed over the programmable material within remaining volume of the openings and spaced upper second lines are formed which cross the first lines elevationally over the conductive upper electrode material that is within the openings. A select device is between the lower electrode pillar and the underlying first line or is between the conductive upper electrode material and the overlying second line for the individual memory cells.

In some embodiments, a method of forming an array of cross point memory cells comprises forming first spaced openings longitudinally along and elevationally over spaced lower first lines. The first openings are between first opposing walls that are between the first lines and are between second opposing walls that are along and elevationally over the first lines. Lower electrode pillars for individual of the memory cells are formed within individual of the first openings. The first opposing walls are removed to form second spaced openings between the first lines. The second openings are between the second opposing walls and the electrode pillars. The second openings are lined with programmable material of the memory cells being formed to less-than-fill the second openings with the programmable material. Conductive upper electrode material is formed over the programmable material within remaining volume of the second openings and spaced upper second lines are formed which cross the first lines elevationally over the conductive upper electrode material within the second openings. A select device is between the lower electrode pillars and the underlying first line or is provided between the conductive upper electrode material and the overlying second line for the individual memory cells.

In some embodiments, an array of cross point memory cells comprises spaced lower first lines, spaced upper second lines which cross the first lines, and an individual memory cell between the first lines and the second lines where such cross. The individual memory cells comprise a select device and a programmable device in series with each other. The select device is proximate and electrically coupled to one of the first or second lines. The programmable device is proximate and electrically coupled to one of the other of the first or second lines. The programmable device comprises a first pillar electrode elevationally over the one of the first lines. The first pillar electrode comprises a top and opposing sidewalls. Programmable material is laterally outward of the opposing sidewalls of the first pillar electrode. A second electrode is outward of the programmable material laterally over the opposing sidewalls of the first pillar electrode. One of the first pillar electrode or the second electrode is electrically coupled to the select device. The other of the first pillar electrode or the second electrode is electrically coupled to the one of the other of the first or second lines.

In some embodiments, an array of memory cells comprises spaced lower first lines, spaced upper second lines which cross the first lines, and an individual memory cell between the first lines and the second lines where such cross. The individual memory cells comprise a select device and a programmable device in series with each other. The select device is proximate and directly electrically coupled to one of the first lines. The programmable device is proximate and directly electrically coupled to one of the second lines. The programmable device comprises a first pillar electrode elevationally over and directly electrically coupled to the select device. The first pillar electrode comprises a top and opposing sidewalls. Programmable material is laterally outward of the opposing sidewalls and elevationally over the top of the first pillar electrode. A second electrode is outward of the programmable material laterally over the opposing sidewalls of the first pillar electrode. The second electrode is directly electrically coupled to the one second line.

In some embodiments, an array of memory cells comprises spaced lower first lines, spaced upper second lines which cross the first lines, and an individual memory cell between the first lines and the second lines where such cross. The individual memory cells comprise a select device and a programmable device in series with each other. The select device is proximate and electrically directly coupled to one of the second lines. The programmable device is proximate and directly electrically coupled to one of the first lines. The programmable device comprises a first pillar electrode elevationally over and directly electrically coupled to the one first line. The first pillar electrode comprises a top and opposing sidewalls. Programmable material is laterally outward of the opposing sidewalls and elevationally over the top of the first pillar electrode. A second electrode is outward of the programmable material laterally over the opposing sidewalls of the first pillar electrode. The second electrode is directly electrically coupled to the select device.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array of cross point memory cells comprising:
spaced lower first lines, spaced upper second lines which cross the first lines, and an individual memory cell between the first lines and the second lines where such cross, the individual memory cells comprising:
a select device and a programmable device in series with each other, the select device being proximate and electrically coupled to one of the first or second lines, the programmable device being proximate and electrically coupled to one of the other of the first or second lines; and
the programmable device comprising:
a first pillar electrode elevationally over the one of the first lines, the first pillar electrode comprising elevationally-elongated conductive material and comprising a top and opposing sidewalls;
programmable material laterally outward of the opposing sidewalls of the first pillar electrode;
a second electrode outward of the programmable material laterally over the opposing sidewalls of the first pillar electrode; and
one of the first pillar electrode or the second electrode being electrically coupled to the select device, the other of the first pillar electrode or the second electrode being electrically coupled to the one of the other of the first or second lines.

2. The array of claim 1 wherein the second electrodes of immediately adjacent of the memory cells along individual of the second lines are directly electrically coupled to one another.

3. The array of claim 2 wherein the second electrode comprises a conductive pillar, the immediately adjacent memory cells sharing one of the conductive pillars.

4. The array of claim 3 wherein the first pillar electrode has a maximum conductive material width that is greater than that of the conductive pillar laterally proximate the programmable material that is laterally outward of one of the opposing sidewalls of the first pillar electrode.

5. The array of claim 3 wherein the first pillar electrode has a maximum conductive material volume that is greater than that of the conductive pillar.

6. The array of claim 1 wherein the programmable material is elevationally over the top of the first pillar electrode.

7. The array of claim 6 wherein the programmable material comprises a continuous layer extending over the opposing sidewalls and the top of the first pillar electrode.

8. The array of claim 1 wherein the programmable material is beneath the second electrode between two immediately adjacent of the first lines.

9. The array of claim 1 wherein the second electrode is over the top of the first pillar electrode.

10. The array of claim 9 wherein the second electrode is of an upside-down U-shape in cross-section along its overlying second line.

11. The array of claim 1 wherein the first and second lines angle orthogonally relative one another.

12. An array of memory cells comprising:
spaced lower first lines, spaced upper second lines which cross the first lines, and an individual memory cell between the first lines and the second lines where such cross, the individual memory cells comprising:
a select device and a programmable device in series with each other, the select device being proximate and directly electrically coupled to one of the first lines, the programmable device being proximate and directly electrically coupled to one of the second lines; and the programmable device comprising:
a first pillar electrode elevationally over and directly electrically coupled to the select device, the first pillar electrode comprising elevationally-elongated conductive material and comprising a top and opposing sidewalls;
programmable material laterally outward of the opposing sidewalls and elevationally over the top of the first pillar electrode; and
a second electrode outward of the programmable material laterally over the opposing sidewalls of the first pillar electrode, the second electrode being directly electrically coupled to the one second line.

13. The array of claim 12 wherein the programmable material is continuous over multiple of the tops and sidewalls of multiple of the first pillar electrodes and beneath multiple of the second electrodes between immediately adjacent of the first lines.

14. An array of memory cells comprising:
spaced lower first lines, spaced upper second lines which cross the first lines, and an individual memory cell between the first lines and the second lines where such cross, the individual memory cells comprising:
a select device and a programmable device in series with each other, the select device being proximate and directly electrically coupled to one of the second lines, the programmable device being proximate and directly electrically coupled to one of the first lines; and the programmable device comprising:
a first pillar electrode elevationally over and directly electrically coupled to the one first line, the first pillar electrode comprising a top and opposing sidewalls;
programmable material laterally outward of the opposing sidewalls and elevationally over the top of the first pillar electrode; and
a second electrode outward of the programmable material laterally over the opposing sidewalls of the first pillar electrode, the second electrode being directly electrically coupled to the select device.

15. The array of claim 14 wherein the programmable material is continuous over multiple of the tops and sidewalls of multiple of the first pillar electrodes and beneath multiple of the second electrodes between immediately adjacent of the first lines.

16. The array of claim 14 wherein the first pillar electrode comprises elevationally-elongated conductive material.

* * * * *